(12) United States Patent
Gerhard et al.

(10) Patent No.: US 12,348,000 B2
(45) Date of Patent: Jul. 1, 2025

(54) OPTOELECTRONIC COMPONENT AND METHOD FOR PRODUCING AN OPTOELECTRONIC COMPONENT

(71) Applicant: OSRAM Opto Semiconductors GmbH, Regensburg (DE)

(72) Inventors: Sven Gerhard, Alteglofsheim (DE); André Somers, Obertraubling (DE); Harald König, Bernhardswald (DE); Muhammad Ali, Cambridge (GB)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 1039 days.

(21) Appl. No.: 17/312,113

(22) PCT Filed: Nov. 27, 2019

(86) PCT No.: PCT/EP2019/082725
§ 371 (c)(1),
(2) Date: Oct. 20, 2021

(87) PCT Pub. No.: WO2020/120137
PCT Pub. Date: Jun. 18, 2020

(65) Prior Publication Data
US 2022/0337027 A1    Oct. 20, 2022

(30) Foreign Application Priority Data

Dec. 10, 2018    (DE) .......................... 102018131579.1

(51) Int. Cl.
*H01S 5/042*    (2006.01)
*H01S 5/02375*    (2021.01)
(Continued)

(52) U.S. Cl.
CPC ........ *H01S 5/0261* (2013.01); *H01S 5/02375* (2021.01); *H01S 5/02476* (2013.01); *H01S 5/0262* (2013.01)

(58) Field of Classification Search
CPC ............... H01S 5/0262; H01S 5/04254; H01S 5/02469; H01S 5/04252; H01S 5/22; H01L 2933/0066; H01L 33/647
See application file for complete search history.

(56) References Cited

U.S. PATENT DOCUMENTS

| | | | | |
|---|---|---|---|---|
| 5,311,539 A | * | 5/1994 | Behfar-Rad | G02B 6/122 372/50.1 |
| 2006/0039428 A1 | * | 2/2006 | Kondou | B82Y 20/00 372/43.01 |

(Continued)

FOREIGN PATENT DOCUMENTS

| | | |
|---|---|---|
| CN | 104040738 A | 9/2014 |
| CN | 106099640 A | 11/2016 |

(Continued)

OTHER PUBLICATIONS

International Search Report (with English translation) and Written Opinion mailed Jan. 30, 2020 for corresponding International Application No. PCT/EP2019/082725, 15 pages.

(Continued)

*Primary Examiner* — Yuanda Zhang
(74) *Attorney, Agent, or Firm* — MH2 Technology Law Group LLP

(57) ABSTRACT

Disclosed is an optoelectronic component comprising:
an optoelectronic semiconductor chip which generates electromagnetic radiation during operation, and
a metallic layer provided on the semiconductor chip, wherein
an outer surface of the metallic layer has a patterning,
(Continued)

the component can be identified by means of the patterning, and the metallic layer is continuous.

Also disclosed is a method for producing an optoelectronic component.

19 Claims, 7 Drawing Sheets

(51) Int. Cl.
   *H01S 5/024* (2006.01)
   *H01S 5/026* (2006.01)

(56) References Cited

U.S. PATENT DOCUMENTS

| | | | |
|---|---|---|---|
| 2009/0146308 A1* | 6/2009 | Shiozawa | H01S 5/22 257/761 |
| 2010/0224887 A1 | 9/2010 | Shibata et al. | |
| 2012/0025251 A1 | 2/2012 | Kazama | |
| 2012/0074438 A1 | 3/2012 | Hwang et al. | |
| 2013/0026448 A1* | 1/2013 | Chu | H01L 33/641 438/47 |
| 2014/0064311 A1 | 3/2014 | Eichler et al. | |
| 2014/0319547 A1 | 10/2014 | Rode et al. | |
| 2017/0330996 A1 | 11/2017 | Lell et al. | |
| 2019/0355768 A1 | 11/2019 | Eichler et al. | |

FOREIGN PATENT DOCUMENTS

| | | |
|---|---|---|
| CN | 107394581 A | 11/2017 |
| CN | 107394583 A | 11/2017 |
| DE | 102014108300 A1 | 12/2015 |
| JP | S5883166 A | 5/1983 |
| JP | S5883166 U | 6/1983 |
| JP | S58125876 A | 7/1983 |
| JP | S596840 A | 1/1984 |
| JP | S596840 U | 1/1984 |
| WO | 2012107967 A1 | 8/2012 |

OTHER PUBLICATIONS

Meng, Z., Chinese Office Action issued in corresponding Chinese Patent Application No. 2019800804371 dated Sep. 25, 2023, with English translation, 8 pages.

Chinese Office Action with English Translation mailed Apr. 3, 2024, in corresponding CN Application No. 2019800804371. (18 Pages).

* cited by examiner

OPTOELECTRONIC COMPONENT AND METHOD FOR PRODUCING AN OPTOELECTRONIC COMPONENT

CROSS-REFERENCE TO RELATED APPLICATIONS

This patent application is a national stage entry from International Application No. PCT/EP2019/082725, filed on Nov. 27, 2019, published as International Publication No. WO 2020/120137 A1 on Jun. 18, 2020, and claims priority under 35 U.S.C. § 119 from German patent application 10 2018 131 579.1, filed Dec. 10, 2018, the entire contents of all of which are incorporated by reference herein.

FIELD

An optoelectronic component is specified. Furthermore, a method for producing such an optoelectronic component is specified.

BACKGROUND

An object to be solved is to specify an optoelectronic component which has a particularly efficient heat dissipation. A further object to be solved is to disclose a method for producing such an optoelectronic component.

SUMMARY

The optoelectronic component is, for example, a radiation-emitting component which emits electromagnetic radiation during operation. For example, the optoelectronic component is a laser diode or a light emitting diode. Further, the optoelectronic component can also be a component that receives electromagnetic radiation, for example a photodiode. The optoelectronic component has a main extension plane. Lateral directions are aligned, for example, parallel to the main extension plane and a vertical direction is aligned perpendicular to the lateral directions.

According to at least one embodiment, the optoelectronic device comprises a semiconductor chip which generates or receives electromagnetic radiation during operation. The optoelectronic semiconductor chip is, for example, a laser diode chip or a light emitting diode chip, in short LED chip, or a photodiode chip.

For example, the optoelectronic semiconductor chip has a first main surface and a second main surface being opposite to one another.

For example, the optoelectronic semiconductor chip is a laser diode, in particular a semiconductor laser diode. In operation, the semiconductor laser diode emits electromagnetic radiation, such as monochromatic and coherent laser light. The laser light is preferably emitted via a side surface of the semiconductor laser diode. The side surface of the semiconductor laser diode is preferably substantially perpendicular to the main extension plane. Essentially perpendicular means that the side surface is inclined by at most 5° to the normal of the main extension plane.

Alternatively, the optoelectronic semiconductor chip is a light-emitting diode chip. The light-emitting diode chip is preferably formed to emit electromagnetic radiation, in particular visible light. The emitted light is then preferably emitted from the semiconductor chip via a radiation exit surface. The radiation exit surface is formed, for example, by the second main surface of the semiconductor chip.

According to at least one embodiment, the optoelectronic component comprises a metallic layer arranged on the optoelectronic semiconductor chip. The metallic layer can, for example, be in direct contact with the optoelectronic semiconductor chip with a bottom surface. Side surfaces of the metallic layer connect the bottom surface to an opposite top surface. For example, the metallic layer is arranged on the first main surface of the optoelectronic semiconductor chip. Further, the metallic layer covers, for example, a large portion of the optoelectronic semiconductor chip. For example, the metallic layer covers at least 70%, in particular at least 95%, of the first main surface of the optoelectronic semiconductor chip.

The metallic layer has, for example, a thickness in vertical direction of at least 0.05 micrometres and at most 15 micrometres. For example, the metallic layer comprises or consists of one or more of the following metals: Cu, Ti, Pt, Au, Ni, ZnO, TiWN, Rh, Pd, Cr, ITO.

According to at least one embodiment, an outer surface of the metallic layer comprises a structuring. The outer surface of the metallic layer is an exposed outer surface that is not covered by the optoelectronic semiconductor chip. That is, the outer surface is formed by the side surfaces of the metallic layer and the top surface of the metallic layer.

The structuring is preferably machine readable. That is to say that the information for identifying the optoelectronic component can be read, for example, by means of a reader. The reader is preferably formed to detect and recognise the structuring. The optoelectronic component can thus be uniquely identified by means of the structuring.

According to at least one embodiment, an identification of the component is made possible by means of the structuring. The structuring is formed, for example, by recesses in the metallic layer. Alternatively or additionally, it is possible that the structuring is formed by roughened regions of the metallic layer.

For example, the metallic layer can be distinguished in the region of the recesses from the metallic layer in the region without the recesses. Furthermore, the roughened regions, for example, are also distinguishable from the non-roughened regions of the metallic layer. Consequently, the structuring, which enables identification of the component, is recognisable, for example, by a reader provided for this purpose.

According to at least one embodiment, the metallic layer is formed continuously. Accordingly, the metallic layer is arranged uninterrupted over the optoelectronic semiconductor chip.

If the metallic layer has the recesses, the recesses are arranged, for example, at an edge region of the metallic layer. Furthermore, the metallic layer has, for example, no recesses which are completely surrounded by the metallic layer and which completely penetrate the metallic layer. The absence of such recesses completely surrounded by the metallic layer prevents the formation of cavities in such recesses, where heat accumulation can occur when the component is applied on, for example, a soldering surface.

In this case, the metallic layer is simply connected, for example. In addition, the outer surface of the metallic layer can be integrally formed with the structuring in this case.

Furthermore, it is possible that the metallic layer has recesses that are completely surrounded by the metallic layer. In this case, the recesses can completely penetrate the metallic layer.

If the outer surface of the metallic layer has the roughened regions, the roughened regions are formed of the same material as the metallic layer, for example. That is to say that the outer surface of the metallic layer with the structuring can be formed integrally.

In at least one embodiment, the optoelectronic component comprises an optoelectronic semiconductor chip which generates electromagnetic radiation during operation, and a metallic layer which is arranged on the semiconductor chip, wherein an outer surface of the metallic layer has a structuring, by means of which structuring identification of the component is made possible, and the metallic layer is formed continuously.

One idea of the optoelectronic component described here is, inter alia, that a structuring for identifying the component is arranged on an outer surface of the metallic layer. Furthermore, the metallic layer is formed continuously. This allows current that is impressed into the metallic layer to be distributed homogeneously over the entire metallic layer. Likewise, occurring heat can advantageously be distributed homogeneously over the metallic layer. Advantageously, the metallic layer thus does not have any regions with an increased current density or heat density during operation.

According to at least one embodiment, no non-metallic elements are applied on the outer surface of the metallic layer. The metallic layer is thus freely accessible, for example, on the outer surface. The structuring is thus not formed by non-metallic elements arranged on the layer.

According to at least one embodiment, the metallic layer is designed as a heat sink. The heat generated in the optoelectronic semiconductor chip can preferably be dissipated through the metallic layer. Since the metallic layer is formed continuously and no non-metallic elements are applied on the outer surface of the metallic layer, heat can advantageously be transported away from the optoelectronic semiconductor chip particularly well via the metallic layer. Furthermore, the structuring advantageously increases the surface of the metallic layer compared to a metallic layer without structuring. This also results in an improved heat dissipation from the optoelectronic semiconductor chip.

According to at least one embodiment, the metallic layer is formed as a contact layer for electrical contacting of the semiconductor chip. The optoelectronic semiconductor chip can, for example, be energised by means of the metallic layer.

Typically, non-metallic elements are not electrically conductive and have a comparatively low thermal conductivity. Since preferably no such non-conductive elements are arranged on the metallic layer, the metallic layer can advantageously dissipate occurring heat in the semiconductor chip particularly well homogeneously. Furthermore, the described metallic layer can also impress current particularly homogeneously into the semiconductor chip.

According to at least one embodiment, the metallic layer is a functional layer of the optoelectronic component and has several functions. For example, the metallic layer functions to identify the component. Furthermore, the metallic layer can be formed as a heat sink and/or as a contact layer for electrical conversion of the semiconductor chip.

The metallic layer thus advantageously combines several different properties. This makes the component particularly easy to produce, since only the metallic layer has to be applied. Additional heat sinks and contact layers are not coercively necessary. Such an optoelectronic component is particularly cost-effective.

According to at least one embodiment, the semiconductor chip has a ridge waveguide with a top surface and side surfaces adjacent thereto. Thus, the semiconductor chip in this embodiment is a laser diode. The optoelectronic semiconductor chip comprises, for example, a semiconductor layer sequence. The ridge waveguide is preferably formed by a ridge-shaped elevated region of the semiconductor layer sequence. For example, the ridge waveguide protrudes as a protrusion from a recessed outer surface of the semiconductor layer sequence. The ridge waveguide thereby preferably extends in a lateral direction.

The top surface of the ridge waveguide is directly connected to the recessed outer surface of the semiconductor layer sequence, which is arranged lateral to the ridge waveguide, via the adjoining side surfaces. The side surfaces thereby provide a distance between the recessed outer surface lateral to the ridge waveguide and the top surface of the ridge waveguide in a vertical direction. For example, the top surface and the side surfaces of the ridge waveguide and the recessed outer surface of the semiconductor layer sequence lateral to the ridge waveguide form a step profile. Further, the first main surface of the semiconductor chip comprises the top surface and the side surface of the ridge waveguide and the recessed outer surface of the semiconductor layer sequence lateral to the ridge waveguide.

For example, an active layer is arranged between the side surfaces of the ridge waveguide. Alternatively, it is possible that the active layer is arranged in the semiconductor layer sequence below the ridge waveguide. That is to say in this case the active layer also extends below the recessed outer surfaces of the semiconductor layer sequence.

In addition, a contact can be arranged on the top surface of the ridge waveguide, which is in direct contact with the top surface of the ridge waveguide and preferably covers it completely. In this case, the contact is formed electrically conductive and is electrically conductively connected to the top surface of the ridge waveguide.

According to at least one embodiment, a passivation layer covers the side surfaces of the ridge waveguide. Furthermore, the passivation layer preferably covers the recessed outer surface of the semiconductor layer sequence lateral to the ridge waveguide. For example, the passivation layer covers the side surface of the ridge waveguide in particular completely. Further, the passivation layer covers the recessed outer surfaces, for example, completely. The top surface of the ridge waveguide is in particular not covered by the passivation layer and is therefore free of it.

If the optoelectronic semiconductor chip has the contact, the passivation layer can cover side surfaces of the contact. For example, the passivation layer completely covers the side surfaces of the contact. A top surface of the contact is preferably not covered with the passivation layer.

The passivation layer is preferably formed electrically insulating. The passivation layer comprises, for example, an oxide, nitride or oxynitride or consists of one of these materials. Suitable oxides, nitrides or oxinitrides are, for example, silicon dioxide, silicon nitride, silicon oxinitride, aluminium oxide, tantalum oxide, rhodium oxide, niobium oxide and/or titanium dioxide. Also other oxides, nitrides and oxinitrides comprising one or more of the following: Al, Ce, Ga, Hf, In, Mg, Nb, Rh, Sb, Si, Sn, Ta, Ti, Zn, Zr, can be suitable as a material for one of the passivation layers.

According to at least one embodiment, the metallic layer is in direct contact with the top surface of the ridge waveguide. For example, the semiconductor layer sequence of the optoelectronic semiconductor chip is in direct contact with the metallic layer. Thus, the semiconductor layer sequence can be electrically conductively connected to the top surface of the ridge waveguide via the metallic layer. The metallic layer further covers, for example, the passivation layer over the semiconductor layer sequence.

According to at least one embodiment, the structuring extends without overlapping with the top surface of the ridge waveguide in top view. A lateral extension of the structuring does not, for example, extend over the side surfaces of the ridge waveguide. Advantageously, a particularly compact design of the optoelectronic component is thus achieved.

According to at least one embodiment, the structuring comprises recesses.

According to at least one embodiment, at least a part of the recesses completely penetrates the metallic layer. The recesses penetrate the metallic layer in a vertical direction. A bottom surface of the recesses is formed by the optoelectronic semiconductor chip. For example, the bottom surface of the recesses can be formed by the passivation layer.

According to at least one embodiment, at least a part of the recesses partially penetrates the metallic layer. In this case, a bottom surface of the recesses is formed by the metallic layer.

In the edge region of the metallic layer, the metallic layer between the recesses in this case has a thickness which is smaller than the thickness of the metallic layer in a region which has no recesses. For example, a top surface and a side surface adjacent thereto of the metallic layer in the region not having recesses and the bottom surface of the recesses form a step profile.

The thickness in the edge region of the metallic layer in the region of the recesses is preferably less than 10 micrometres and at least 0.05 micrometres.

In addition, the structuring can be formed, for example, by recesses which completely penetrate the metallic layer and recesses which do not completely penetrate the metallic layer.

According to at least one embodiment, the structuring comprises roughened regions. Preferably, the roughened regions have protrusions and depressions. Further, the roughened regions can have a thickness that is less than the thickness of the metallic layer not having roughened regions. Alternatively, the thickness of the roughened regions can be, for example, greater than the thickness of the second metallic layer not having roughened regions. Advantageously, the two different regions can be better distinguished by the difference in height.

The thickness in the edge region of the metallic layer in the region of the roughened regions is preferably less than 5 micrometres and at least 0.05 micrometres.

In addition, the structuring can be formed, for example, by recesses and the roughened regions.

According to at least one embodiment, the structuring forms a bar code for identifying the component. For example, if the metallic layer has the recesses, the recesses form a plurality of stripes each having a width and a length.

If the structuring comprises roughened regions, the roughened regions form the plurality of stripes each having a width and a length.

For example, the plurality of strips each have a rectangular shape. Edges of the rectangular shape can be rounded. Preferably, the strips of the plurality of strips each have a length that is the same. For example, the strips of the plurality of strips have a length between 5 µm to 100 µm inclusive, preferably 6 µm to 20 µm inclusive.

The width of the strips of the plurality of strips is preferably different. For example, the strips of the plurality of strips each have a width between 1 µm and 100 µm inclusive, preferably between 2 µm to 15 µm inclusive, and particularly preferably between 3 µm and 10 µm.

Alternatively, it is possible that the lengths of the strips of the plurality of strips may also differ from one another. In this case, it is possible that the widths of the strips of the plurality of strips are equal in each case.

By means of the different widths of the strips of the plurality of strips, for example, the bar code is formed. For example, it is possible that the optoelectronic device is arranged on a wafer with a plurality of other optoelectronic devices during a method for producing an optoelectronic device. For example, the bar code encodes the lateral position of the optoelectronic component and the other components of the plurality of other optoelectronic components, respectively. For example, the bar code is implemented as a 2/5 interleave, code 128, code 11, code 39, code 93 or MSI code ("modified plessey code").

Alternatively, the structuring forms a QR code (Quick Response Code) for identifying the component. If the structuring is formed by the recesses, the recesses are arranged along rows and columns, for example, and form a QR matrix. In this case, the recesses do not penetrate the metallic layer in order to avoid unwanted heat accumulation.

If the structuring is formed by the roughened regions, the roughened regions are arranged along rows and columns, for example, and form the QR matrix. The QR matrix can comprise, for example, the recesses and the roughened regions.

According to at least one embodiment, the metallic layer is a metallic layer stack. For example, the metallic layer stack comprises a plurality of layers.

According to at least one embodiment, the layer stack comprises a first metallic layer and a second metallic layer. For example, if the optoelectronic semiconductor chip comprises a ridge waveguide, the first metallic layer covers the side surfaces and the top surface of the ridge waveguide. Further, the first metallic layer is partially arranged over the recessed outer surface of the semiconductor layer sequence. In this case, the first metallic layer embeds the ridge waveguide.

For example, the second metallic layer can embed the first metallic layer. Embedding in this case means that the second metallic layer completely covers an outer surface of the first metallic layer facing away from the semiconductor layer sequence. The second metallic layer further covers the recessed outer surfaces of the semiconductor layer sequence not being covered by the first metallic layer. In this case, the second metallic layer has the recesses and/or the roughened regions. For example, the recesses do not overlap with the first metallic layer in top view.

Advantageously, the first metallic layer is thus encapsulated by the second metallic layer and results in improved protection of the ridge waveguide.

If the roughened regions form the structuring, the first metallic layer can be arranged completely over the recessed outer surface of the semiconductor layer sequence. In this case, the roughened regions can overlap with the first metallic layer in top view. For example, the second metallic layer also embeds and advantageously encapsulates the first metallic layer in this case.

If the metallic layer comprises the layer stack, for example, the first metallic layer is different from the second metallic layer. For example, the first metallic layer comprises a material that is different from the second metallic layer.

According to at least one embodiment, the first metallic layer comprises a metallic adhesion promoting layer and a metallic barrier layer. For example, the metallic adhesion promoter layer imparts a particularly good adhesion on the passivation layer and the top surface of the ridge waveguide or the top surface of the contact to a metallic barrier layer to be arranged thereon. The metallic barrier layer advantageously prevents migration of chemical substances in the semiconductor chip.

If the metallic adhesion promoter layer and the metallic barrier layer are further encapsulated by the second metallic layer, the protection of the semiconductor chip from external chemical influences is further improved.

Alternatively, the first metallic layer can comprise a plurality of metallic layers. For example, the first metallic layer comprises three layers. In this case, the layer sequence of the first metallic layer is for example as follows: Ti—Pt—Pd, wherein the second metallic layer is deposited on the Pd layer.

A method for producing an optoelectronic device is further specified. Preferably, the method is suitable for producing an optoelectronic component described herein. That is to say that an optoelectronic component described herein is producible by the described method or is produced by the described method. All features disclosed in connection with the optoelectronic component are therefore also disclosed in connection with the method and vice versa.

According to at least one embodiment of the method, an optoelectronic semiconductor chip is provided.

According to at least one embodiment of the method, a metallic layer is applied on the optoelectronic semiconductor chip. The metallic layer is deposited, for example, by means of chemical vapour deposition (CVD) or physical vapour deposition (PVD). Furthermore, it is possible that the metallic layer is deposited by means of atomic layer deposition (ALD).

According to at least one embodiment of the method, the metallic layer is a metallic layer stack. For example, it is possible that metallic layers of the metallic layer stack are deposited by different deposition methods.

According to at least one embodiment of the method, a first metallic layer and a second metallic layer are subsequently applied on top of one another on the optoelectronic semiconductor chip. For example, it is possible that the metallic layers are applied at least in regions on a passivation layer of the optoelectronic semiconductor chip and a top surface of a semiconductor layer sequence of the optoelectronic semiconductor chip.

For example, recesses are generated in the metallic layer. The recesses are created, for example, by material removal in regions of the recesses of the metallic layer. The recesses can be created, for example, by means of a laser process or by means of plasma-based dry etching processes or wet chemical etching processes. Furthermore, the recesses can be created using lift-off techniques.

According to at least one embodiment of the method, at least a part of recesses penetrates the second metallic layer to the first metallic layer. In this case, the recesses do not completely penetrate the metallic layer. The recesses thus expose the first metallic layer in the regions of the recesses.

According to at least one embodiment of the method, a perturbation layer is applied on the exposed first metallic layer. For example, the perturbation layer comprises an oxide. For example, the perturbation layer can be applied using a deposition process. Further, the exposed first metallic layer can be oxidised using, for example, an oxygen plasma treatment. Alternatively, the exposed first metallic layer can be heated in an oxygen atmosphere. A surface of the exposed first metallic layer is thus oxidised and forms, for example, the perturbation layer.

If, for example, a second metallic layer is applied on the perturbation layer, the second metallic layer has an increased defect density compared to the second metallic layer applied on the first metallic layer. A comparatively homogeneous growth of the second metallic layer is thus disturbed, for example.

According to at least one embodiment of the method, a further second metallic layer is applied on the perturbation layer. An outer surface of the further second metallic layer, which is applied on the perturbation layer, has an increased roughness compared to the second metallic layer. Preferably, the metallic layer comprising the metallic layer stack comprises the further second metallic layer.

For example, the further second metallic layer can be formed from the same material as the second metallic layer. Alternatively, the further second metallic layer can be different from the material of the second metallic layer.

Further, a thickness of the further second metallic layer can be, for example, smaller than the thickness of the second metallic layer. Alternatively, the thickness of the further second metallic layer can be, for example, greater than the thickness of the second metallic layer.

According to at least one embodiment of the method, a stop layer is applied on the metallic layer in regions. For example, a stop layer is applied on the second metallic layer regionally. The stop layer prevents, for example, a further metallic layer from growing on the stop layer. A region of the metallic layer being covered by the stop layer subsequently has no structuring.

According to at least one embodiment of the method, a further metallic layer is galvanically applied on the region not covered by the stop layer. For example, a further second metallic layer is galvanically applied on the regions not covered by the stop layer. An outer surface of the further metallic layer, which is galvanically applied, has an increased roughness compared to the metallic layer.

The stop layer can be removed in a further method step.

BRIEF DESCRIPTION OF THE DRAWINGS

In the following, the optoelectronic components described herein as well as the method described herein will be explained in more detail with reference to exemplary embodiments and the associated figures. They show.

DETAILED DESCRIPTION

Identical, similar or similar acting elements are provided with the same reference signs in the Figures. The Figures and the proportions of the elements shown in the Figures are not to be regarded as true to scale. Rather, individual elements can be shown exaggeratedly large for better representability and/or for better comprehensibility.

Figure 1A:
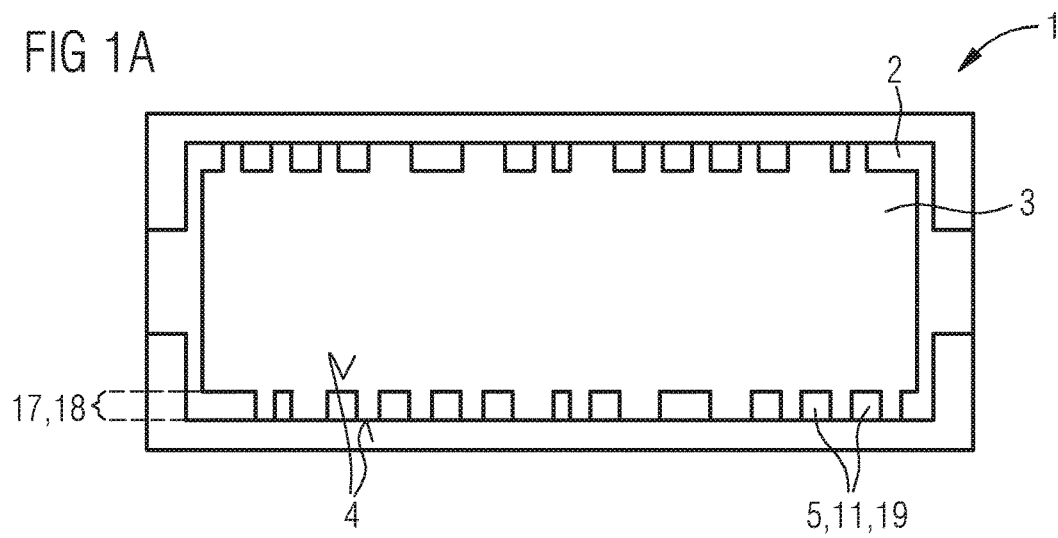
FIGS. 1A and 1B schematic top view of an exemplary embodiment of an optoelectronic component described herein, respectively, FIGS. 2A and 2B schematic sectional views of an exemplary embodiment of an optoelectronic component described herein, FIG. 3 schematic sectional views of an exemplary embodiment of an optoelectronic component described herein, FIG. 4 schematic sectional views in top view of an exemplary embodiment of an optoelectronic component described herein, FIG. 5 schematic sectional views of an exemplary embodiment of an optoelectronic component described herein, FIGS. 6A, 6B, 6C, 6D schematic sectional views of method steps of an exemplary embodiment of a method for producing an optoelectronic component described herein, FIGS. 7A, 7B, 7C, 7D schematic sectional views of method steps of an exemplary embodiment of a method for producing an optoelectronic component described herein, FIG. 8 schematic top view of an exemplary embodiment of an optoelectronic component described herein.
Figure 1B:
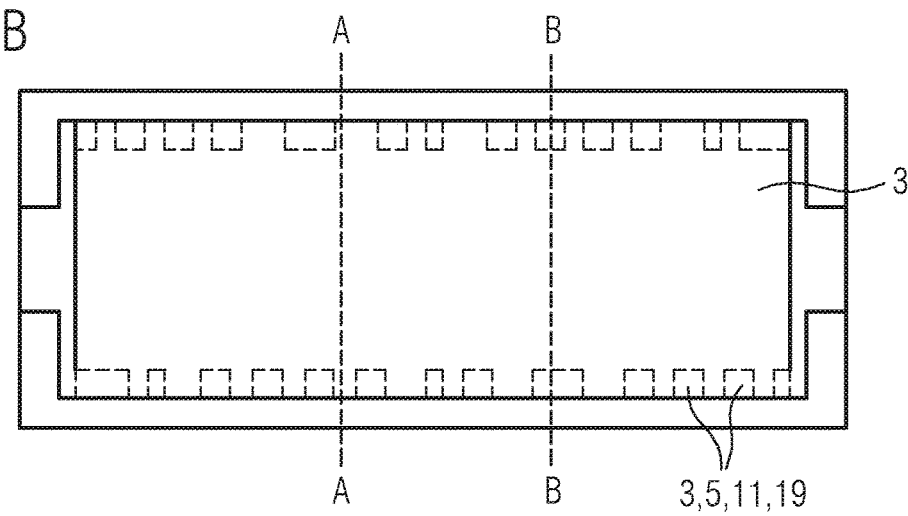

The schematic top views of FIGS. 1A and 1B each show an exemplary embodiment of an optoelectronic component described herein.

According to FIG. 1A, the optoelectronic component 1 has an optoelectronic semiconductor chip 2 which generates electromagnetic radiation during operation. A metallic layer 3 is arranged on the semiconductor chip 2. An outer surface of the metallic layer 4 has a structuring 5. The structuring 5 is arranged over an edge region of the optoelectronic semiconductor chip 17 or in an edge region of the metallic layer 18. The optoelectronic semiconductor chip 2 and the metallic layer 3 overlap completely in top view. The structuring 5 makes it possible to identify the component 1.

The structuring is formed by recesses 11 in the metallic layer 3. The recesses 11 penetrate the metallic layer 3 completely in the vertical direction. A bottom surface of the recesses is formed by the optoelectronic semiconductor chip 2. In this case, the metallic layer does not have any recesses 11 which are completely surrounded by the metallic layer 3 and which completely penetrate the metallic layer 3. In other words, the metallic layer is simply connected. Furthermore, the outer surface of the metallic layer 4 is integrally formed with the structuring 5.

The recesses 11 form a plurality of strips 19, each having a width and a length. The plurality of strips 19 each have a rectangular shape, and the length of each of the plurality of strips 19 is the same. For example, the strips of the plurality of strips have a length between 5 µm to 100 µm inclusive, preferably 6 µm to 20 µm inclusive.

The widths of each of the strips of the plurality of strips 19 are different. For example, the strips of the plurality of strips have a width between 1 µm and 50 µm inclusive, preferably between 2 µm to 15 µm inclusive and more preferably between 3 µm and 10 µm.

By means of the different widths of the strips of the plurality of strips 19, a bar code is formed with which the component 1 can be uniquely identified.

In contrast to FIG. 1A, the exemplary embodiment of FIG. 1B shows recesses which do not completely break through the metallic layer 3. In this case, a bottom surface of the recesses 11 is formed by the metallic layer 3.

Figure 2A:
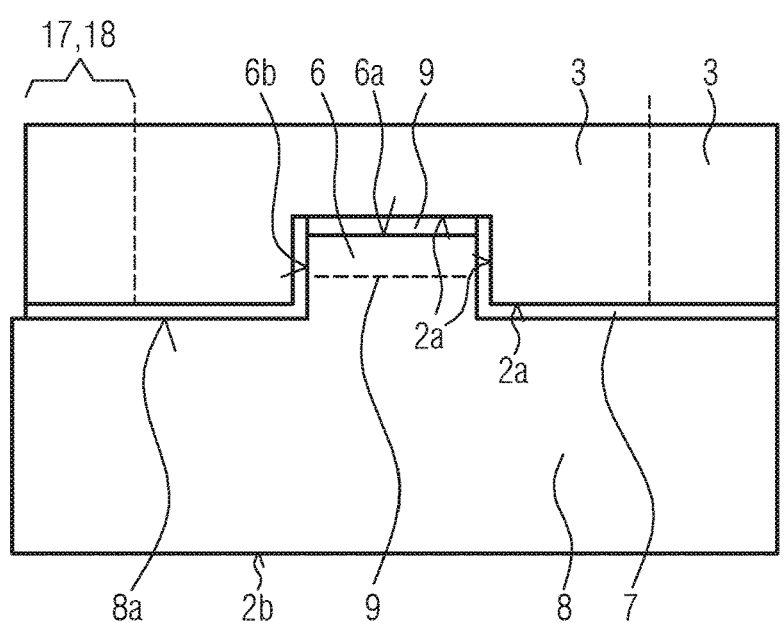

The schematic sectional view of FIG. 2A shows the exemplary embodiment of an optoelectronic component 1 described here along the sectional line A-A shown in FIG. 1B.

According to FIG. 2, the semiconductor chip 2 of the optoelectronic component 1 is a laser diode which has a semiconductor layer sequence 8 and an active layer 9. Furthermore, the semiconductor chip 2 has a ridge waveguide 6 with a top surface 6a and adjoining side surfaces 6b. The ridge waveguide 6 is formed by a ridge-shaped elevated region of the semiconductor layer sequence 8. The ridge waveguide 6 protrudes as a protrusion from a recessed outer surface of the semiconductor layer sequence 8a.

The top surface of the ridge waveguide 6a is directly connected to the recessed outer surface of the semiconductor layer sequence 8a, which is arranged lateral to the ridge waveguide 6, via the side surfaces 6b adjacent thereto. The top surface 6a and the side surfaces 6b of the ridge waveguide and the recessed outer surface of the semiconductor layer sequence 8a lateral to the ridge waveguide 6 form a step profile. Furthermore, a first main surface of the semiconductor chip 2a comprises the top surface 6a and the side surface 6b of the ridge waveguide as well as the recessed outer surface of the semiconductor layer sequence 8a lateral to the ridge waveguide 6. A second main surface 2a is arranged opposite the first main surface 2a.

Furthermore, the semiconductor chip 2 has a passivation layer 7 which completely covers the side surfaces of the ridge waveguide 6b. A contact 9 is arranged on the top surface of the ridge waveguide 6a, the side surfaces of which are also covered by the passivation layer 7. The passivation layer 7 additionally covers the recessed outer surface of the semiconductor layer sequence 8a lateral to the ridge waveguide 6. A top surface of the contact 9 is not covered with the passivation layer 7.

The metallic layer 3 is in direct contact with the top surface of the contact 9. Furthermore, the metallic layer 3 completely covers the passivation layer 7 of the semiconductor chip 2. The metallic layer has, for example, a thickness in the vertical direction of at least 1 micrometre and at most 5 micrometres. The thickness along the cut line A-A is substantially constant over the entire metallic layer. Essentially constant means that the thickness can vary due to manufacturing tolerances.

Figure 2B:
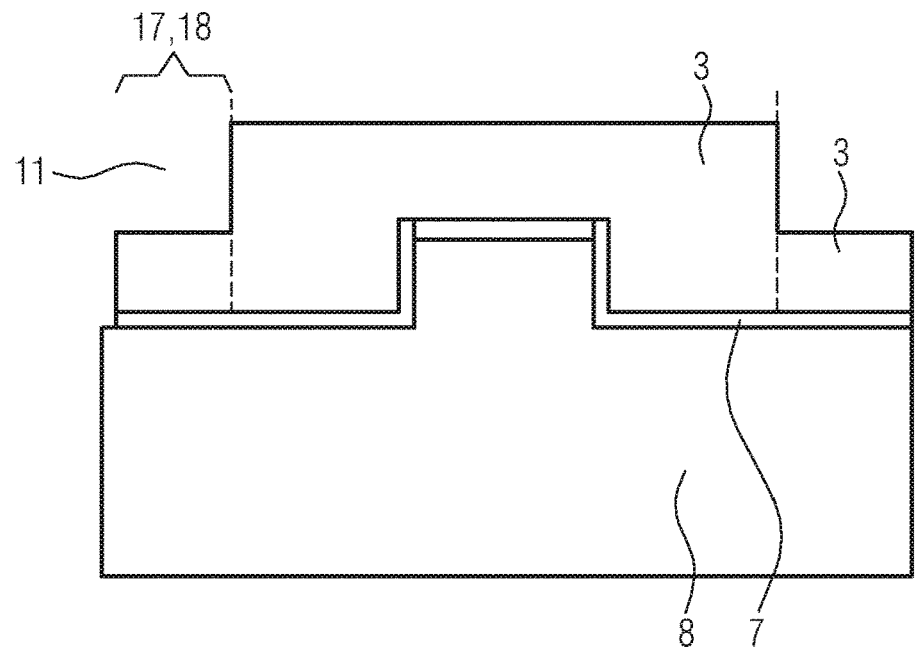

The schematic sectional view of FIG. 2B shows the exemplary embodiment of an optoelectronic component 1 described here along the sectional line B-B shown in FIG. 1B.

In the edge region of the metallic layer 18, the metallic layer between the recesses 11, i.e., along the line of section B-B, has a thickness which is smaller than the thickness of the metallic layer 3 in the region having no recesses 11. A top surface and a side surface of the metallic layer adjacent thereto in the region of the recesses 11 and the bottom surface of the recesses 11 form a step profile.

Figure 3:
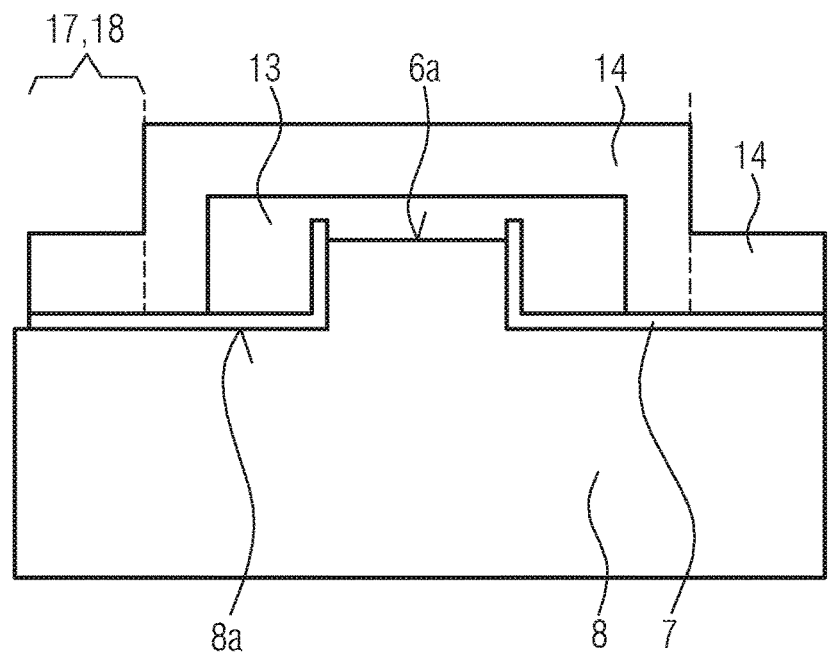

The schematic sectional view of FIG. 3 shows the exemplary embodiment of an optoelectronic component 1 described herein along the sectional line B-B shown in FIG. 1B.

In contrast to the exemplary embodiment in connection with FIG. 2b, the metallic layer 3 of the optoelectronic component 1 according to FIG. 3 is a metallic layer stack. The metallic layer stack comprises a first metallic layer 13 and a second metallic layer 14. Furthermore, the metallic layer 3 is in direct contact with the top surface of the ridge waveguide 6a.

The first metallic layer 13 covers the side surfaces 6b and the top surface 6a of the ridge waveguide. Further, the first metallic layer is partially arranged on the passivation layer 7 over the recessed outer surface of the semiconductor layer sequence 8a. The first metallic layer 13 embeds the ridge waveguide 6.

The second metallic layer 14 embeds the first metallic layer. The second metallic layer 14 further covers the passivation layer 7 over the recessed outer surface of the semiconductor layer sequence 8a being not covered by the first metallic layer 13. In this case, the second metallic layer 14 has the recesses 11. In top view, the recesses 11 extend without overlapping with the first metallic layer 13.

Figure 4:
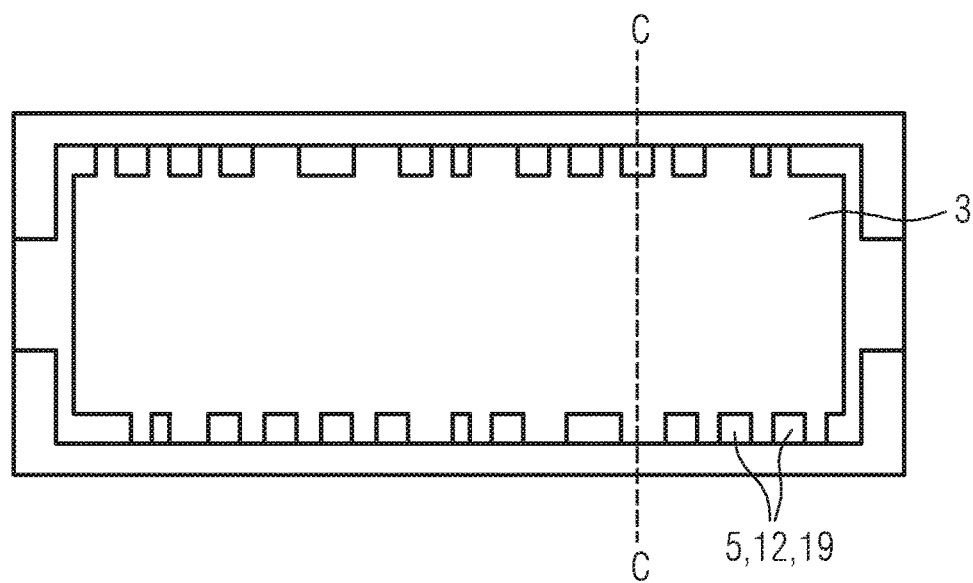

The schematic sectional view in top view of FIG. 4 shows an embodiment of an optoelectronic component 1 described here.

According to FIG. 4, in contrast to the exemplary embodiment in connection with FIGS. 1A and 1B, the structuring is formed by roughened regions 12 of the metallic layer 3. The roughened regions 12 are formed from the same material as the metallic layer 3.

Figure 5:
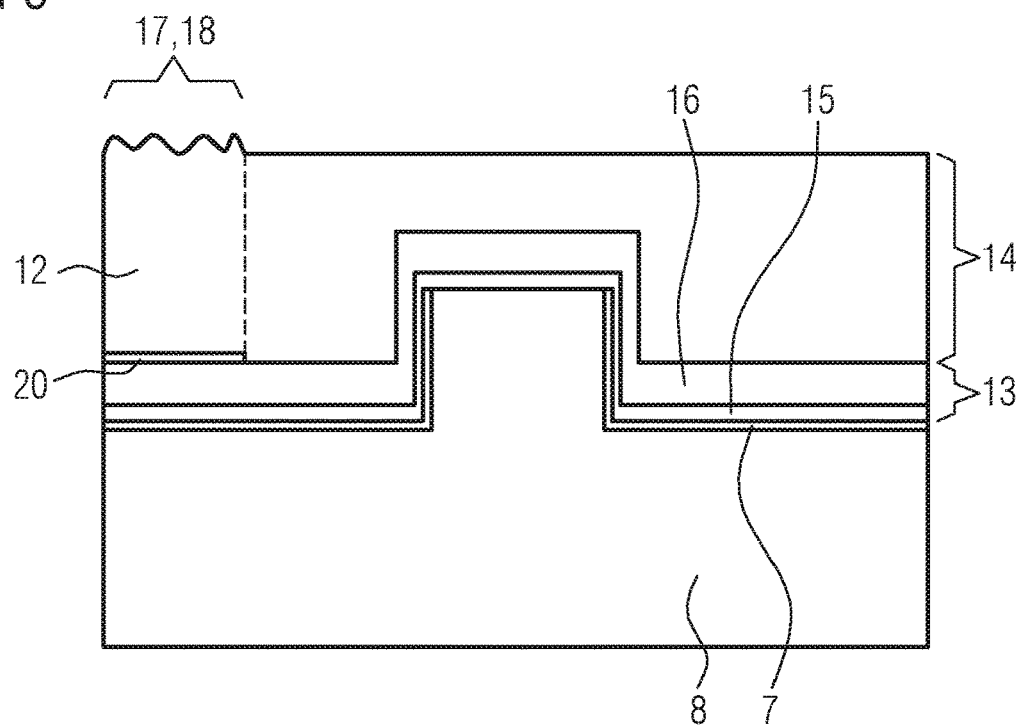

The schematic sectional view of FIG. 5 shows the exemplary embodiment of an optoelectronic component 1 described here along the sectional line C-C shown in FIG. 4.

In contrast to the exemplary embodiment in connection with FIG. 3, the first metallic layer 13 comprises a metallic adhesion promoter layer 15 and a metallic barrier layer 16. A perturbation layer is arranged on the first metallic layer 13 in the edge region of the metallic layer 18. Roughened regions 12 are arranged above the perturbation layer 20. In these regions, the second metallic layer 14 is roughened and has elevations and depressions.

The schematic sectional views of FIGS. 6A, 6B, 6C and 6D show method steps of an exemplary embodiment of a method described herein for producing an optoelectronic component 1.

Figure 6A:
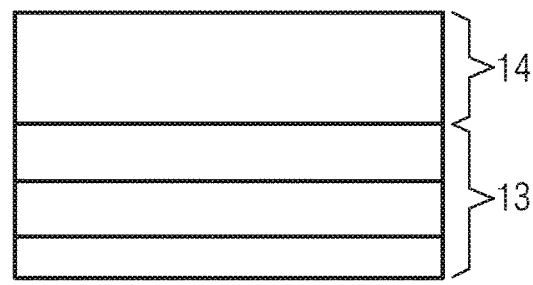

First, an optoelectronic semiconductor chip 2 is provided (not shown here). A metallic layer 3 is then applied on the semiconductor chip 2 as shown in FIG. 6A. The metallic layer 2 is a metallic layer stack and comprises a first metallic layer 13 and a second metallic layer 14. The second metallic layer 14 is arranged on the first metallic layer 13. In this exemplary embodiment, the first metallic layer 13 can comprise, for example, three layers. The layer sequence of the first metallic layer 13 is for example as follows: Ti—Pt—Pd, with the second metallic layer being deposited on the Pd layer. In this exemplary embodiment, the second metallic layer 14 can for example comprise Au or be formed thereof.

Figure 6B:
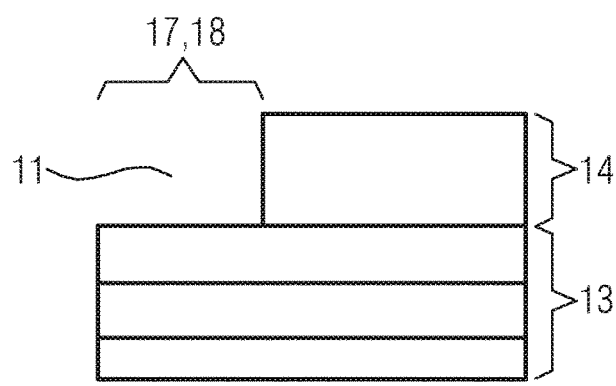

In a next method step, a structuring 5 is produced on an outer surface of the second metallic layer 14. As shown in FIG. 6B, recesses 11 are formed in the second metallic layer 14 in the edge region 18 of the second metallic layer 14. The recesses 11 penetrate the second metallic layer 14 completely up to the first metallic layer 13.

Figure 6C:
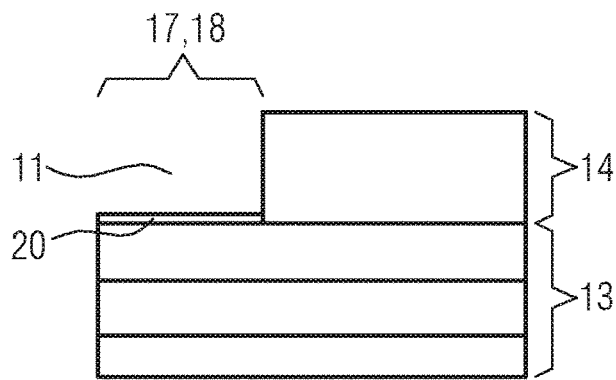

According to FIG. 6C, a perturbation layer 20 is applied on the exposed first metallic layer 13. For example, the exposed first metallic layer 13 can be oxidised by means of an oxygen plasma treatment. Alternatively, it is possible that the exposed first metallic layer 13 is heated in an oxygen atmosphere. A surface of the exposed first metallic layer 13 is thus oxidised and forms, for example, the perturbation layer 20.

In a further method step, a further second metallic layer 14a is applied on the perturbation layer 20. An outer surface of the further second metallic layer 14a applied on the perturbation layer 20 has an increased roughness compared to an outer surface of the second metallic layer 14. The further second metallic layer 14a can be formed from the same metal as the second metallic layer 14. Alternatively, the further second metallic layer 14a can be formed of TiPtAu, for example.

Figure 6D:
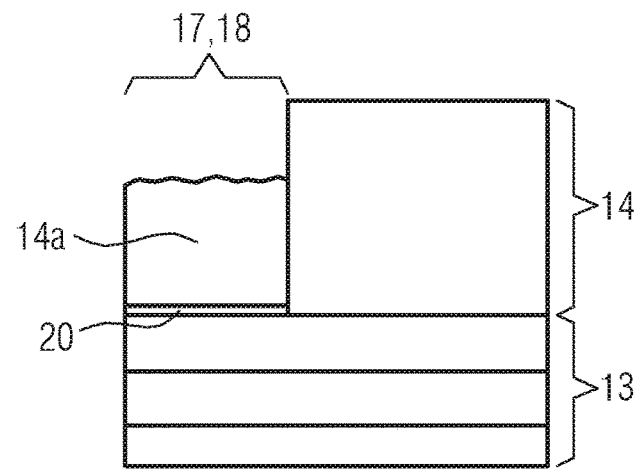

In the exemplary embodiment according to FIG. 6D, a thickness of the further second metallic layer 14a is formed smaller than the thickness of the second metallic layer 14.

The schematic sectional views of FIGS. 7A, 7B, 7C and 7D show method steps of an exemplary embodiment of a method described herein for producing an optoelectronic component 1.

Figure 7A:
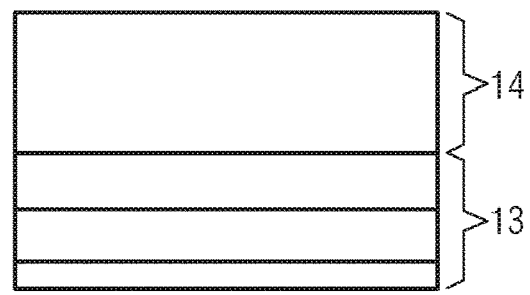

Analogous to the exemplary embodiment in connection with FIG. 6A, an optoelectronic semiconductor chip 2 is provided (not shown here), to which a metallic layer 3 is applied according to FIG. 7A.

Figure 7B:
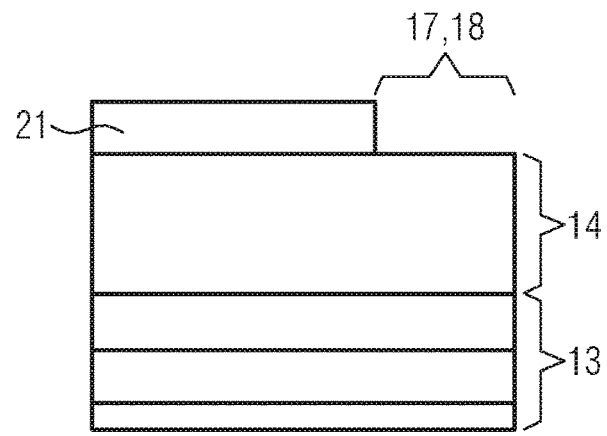

Subsequently, according to FIG. 7B, a stop layer 21 is applied on the metallic layer 3 or on the second metallic layer 14 regionally.

Figure 7C:
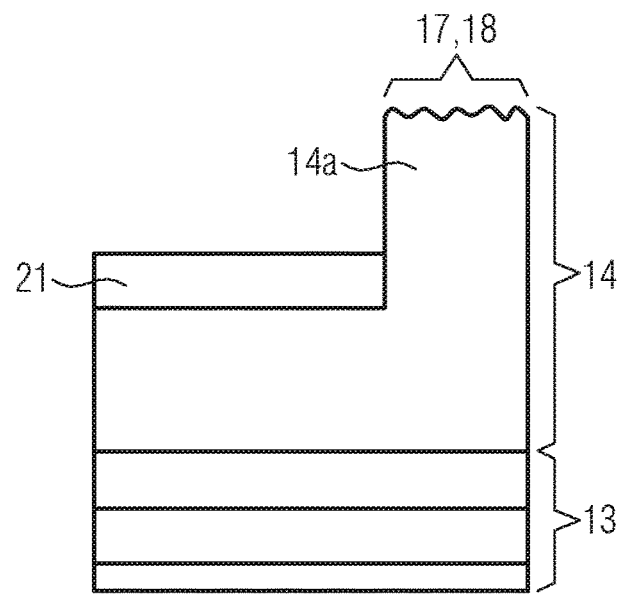

According to FIG. 7C, in a next method step, a further metallic layer or a further second metallic layer 14a is galvanically applied on the regions not covered by the stop layer 21. An outer surface of the further second metallic layer 14a, which is galvanically applied, has an increased roughness compared to an outer surface of the second metallic layer 14.

Figure 7D:
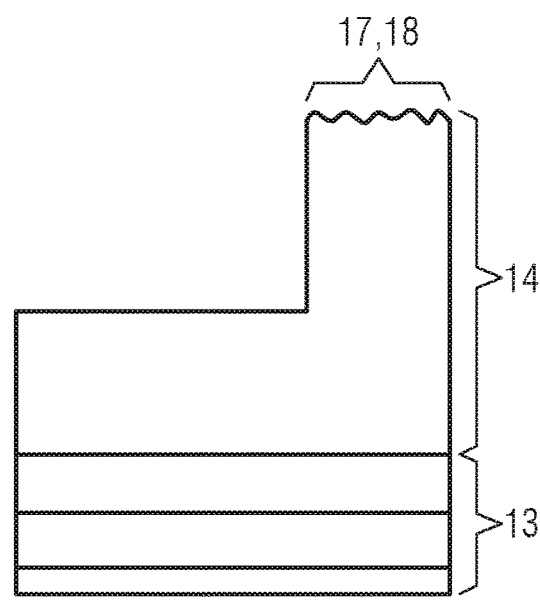

Subsequently, FIG. 7D, the stop layer 21 is removed. In this exemplary embodiment, the thickness of the further second metallic layer 14 is greater than the thickness of the second metallic layer 14.

Figure 8:
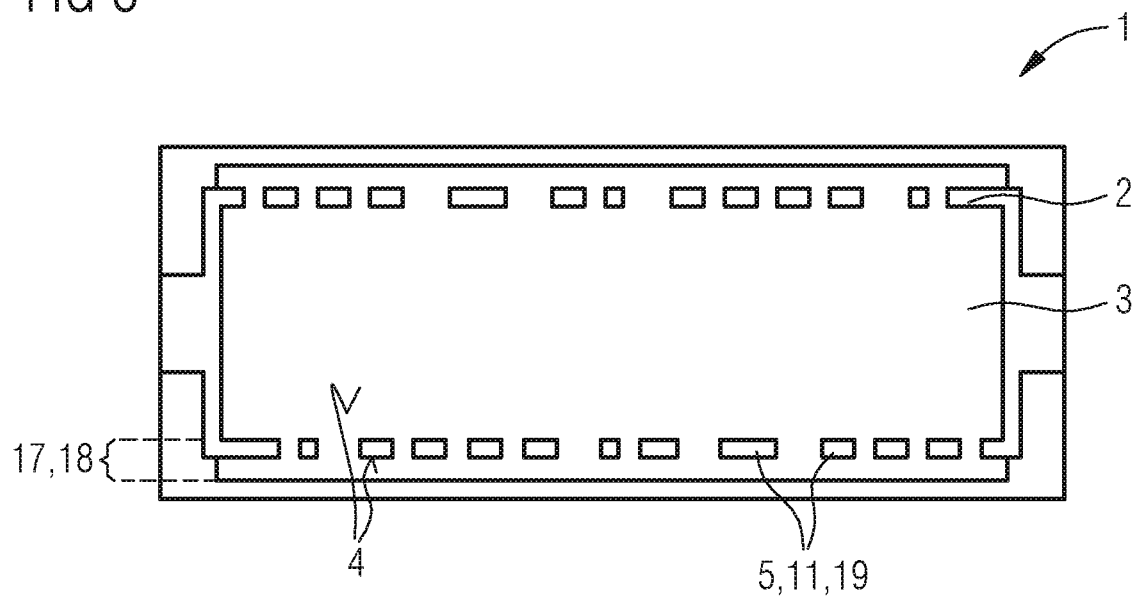

In contrast to the exemplary embodiment of FIG. 1A, the metallic layer according to FIG. 8 has recesses 11 which are completely surrounded by the metallic layer 3 and which completely penetrate the metallic layer 3.

The invention is not limited to the exemplary embodiments by the description based thereon. Rather, the invention encompasses any new feature as well as any combination of features, which in particular includes any combination of features in the claims, even if this feature or combination itself is not explicitly indicated in the claims or exemplary embodiments.

The invention claimed is:

1. An optoelectronic component comprising,
   an optoelectronic semiconductor chip which generates electromagnetic radiation during operation, and
   a metallic layer which is arranged on the semiconductor chip, wherein
   the metallic layer is a metallic layer stack,
   the layer stack comprises a first metallic layer and a second metallic layer,
   the second metallic layer comprises roughened regions,
   a perturbation layer is arranged between the roughened regions and the first metallic layer,
   an outer surface of the metallic layer has a structuring,
   the roughened regions form the structuring,
   identification of the component is made possible by means of the structuring, and
   the metallic layer is formed continuously.

2. The optoelectronic component according to claim 1, in which no non-metallic elements are applied on the outer surface of the metallic layer.

3. The optoelectronic component according to claim 1, in which the metallic layer is formed as a heat sink.

4. The optoelectronic component according to claim 1, in which the metallic layer is formed as a contact layer for electrically contacting the semiconductor chip.

5. The optoelectronic component according to claim 1, in which the metallic layer is a functional layer of the component and has several functions.

6. The optoelectronic component according to claim 1, in which
   the semiconductor chip comprises a ridge waveguide having a top surface and side surfaces adjacent thereto, and
   a passivation layer covers the side surfaces of the ridge waveguide.

7. The optoelectronic component according claim 6, in which the metallic layer is in direct contact with the top surface of the ridge waveguide.

8. The optoelectronic component according to claim 6, in which the structuring extends without overlapping with the top surface of the ridge waveguide in top view.

9. The optoelectronic component according to claim 1, in which the structuring comprises recesses.

10. The optoelectronic component according to claim 9, in which at least a part of the recesses completely penetrates the metallic layer.

11. The optoelectronic component according to claim 9, in which at least a part of the recesses partially penetrates the metallic layer.

12. The optoelectronic component according to claim 1, in which the structuring forms a bar code for identifying the component.

13. The optoelectronic component according to claim 1, wherein the first metallic layer comprises a metallic adhesion promoter layer and a metallic barrier layer.

14. A method for producing an optoelectronic component according to claim 1, comprising the steps,
providing the optoelectronic semiconductor chip,
applying the metallic layer on the optoelectronic semiconductor chip, and
producing the structuring on an outer surface of the metallic layer.

15. The method according to claim 14, wherein
the metallic layer is a metallic layer stack, and
a first metallic layer and a second metallic layer are subsequently applied on top of one another on the semiconductor chip.

16. The method according to claim 14, wherein
at least a part of recesses penetrates the second metallic layer up to the first metallic layer,
a perturbation layer is applied on the exposed first metallic layer, and
a further second metallic layer is applied on the perturbation layer.

17. The method according to claim 14, wherein
a stop layer is applied on the metallic layer in regions, and
a further metallic layer is galvanically applied on the region not covered by the stop layer.

18. An optoelectronic component comprising,
an optoelectronic semiconductor chip which generates electromagnetic radiation during operation, and
a first metallic layer which is arranged on the semiconductor chip, and
a structuring comprising recesses on an outer surface of the metallic layer, and wherein
a perturbation layer is applied on the exposed first metallic layer,
a further second metallic layer is applied on the perturbation layer,
at least a part of the recesses penetrates the second metallic layer up to the first metallic layer,
identification of the component is made possible by means of the structuring, and
the metallic layer is formed continuously.

19. An optoelectronic component comprising,
an optoelectronic semiconductor chip which generates electromagnetic radiation during operation, and
a metallic layer which is arranged on the semiconductor chip, wherein
an outer surface of the metallic layer comprises a structuring,
identification of the component is made possible by means of the structuring,
the metallic layer is formed continuously,
a stop layer is applied on the metallic layer in regions, and
a further metallic layer is galvanically applied on the region not covered by the stop layer.

* * * * *